United States Patent
Hwang et al.

(10) Patent No.: US 11,069,288 B2
(45) Date of Patent: Jul. 20, 2021

(54) MITIGATING SHORTED PIXELS IN AN ORGANIC LIGHT EMITTING DISPLAY PANEL

(71) Applicant: LG Display Co., Ltd., Seoul (KR)

(72) Inventors: SoonJae Hwang, Paju-si (KR); DaeWoong Chun, Paju-si (KR); Sangyoul Lee, Paju-si (KR); Chulwoo Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/718,900

(22) Filed: Sep. 28, 2017

(65) Prior Publication Data

US 2018/0090069 A1    Mar. 29, 2018

(30) Foreign Application Priority Data

Sep. 29, 2016   (KR) .................. 10-2016-0125616

(51) Int. Cl.
 *G09G 3/3233* (2016.01)
 *H01L 27/32* (2006.01)
 *H01L 51/52* (2006.01)

(52) U.S. Cl.
 CPC ....... *G09G 3/3233* (2013.01); *H01L 27/3213* (2013.01); *H01L 51/5206* (2013.01); *G09G 2300/0426* (2013.01); *G09G 2300/0452* (2013.01); *G09G 2300/0819* (2013.01); *G09G 2320/0233* (2013.01); *G09G 2330/08* (2013.01); *G09G 2330/10* (2013.01)

(58) Field of Classification Search
 None
 See application file for complete search history.

(56) References Cited

U.S. PATENT DOCUMENTS

| | | | |
|---|---|---|---|
| 9,129,923 B1* | 9/2015 | Han | H01L 27/3248 |
| 2003/0187597 A1* | 10/2003 | Taguchi | G09G 3/006 |
| | | | 702/65 |
| 2008/0007492 A1* | 1/2008 | Koh | H01L 27/3213 |
| | | | 345/76 |
| 2013/0147858 A1 | 6/2013 | Omoto | |
| 2015/0161943 A1* | 6/2015 | Shim | G09G 3/3225 |
| | | | 345/76 |
| 2015/0187249 A1 | 7/2015 | Tani et al. | |
| 2016/0104419 A1* | 4/2016 | Chung | G09G 3/3225 |
| | | | 345/78 |

(Continued)

FOREIGN PATENT DOCUMENTS

| | | |
|---|---|---|
| CN | 103165077 A | 6/2013 |
| CN | 104700774 A | 6/2015 |

(Continued)

OTHER PUBLICATIONS

China National Intellectual Property Administration, Notification of the First Office Action, CN Patent Application No. 201710810778.2, dated Nov. 8, 2019, 18 pages.

*Primary Examiner* — Amr A Awad
*Assistant Examiner* — Donna V Lui
(74) *Attorney, Agent, or Firm* — Fenwick & West LLP

(57) ABSTRACT

Disclosed are an organic light emitting display panel and an organic light emitting display device including the same, in which a pixel driving circuit of a subpixel, sharing an anode with a white subpixel, of subpixels configuring a unit pixel is disconnected from the outside of the subpixel.

20 Claims, 6 Drawing Sheets

(56) References Cited

U.S. PATENT DOCUMENTS

| | | | |
|---|---|---|---|
| 2016/0133195 A1* | 5/2016 | Park | G09G 3/3225 |
| | | | 345/694 |
| 2016/0189593 A1 | 6/2016 | Lee et al. | |
| 2017/0098398 A1* | 4/2017 | Amatsuchi | G09G 3/006 |
| 2017/0213496 A1 | 7/2017 | Hsu | |

FOREIGN PATENT DOCUMENTS

| | | |
|---|---|---|
| CN | 104752635 A | 7/2015 |
| CN | 105679798 A | 6/2016 |
| JP | 2015-127813 A | 7/2015 |

\* cited by examiner

MITIGATING SHORTED PIXELS IN AN ORGANIC LIGHT EMITTING DISPLAY PANEL

CROSS-REFERENCE TO RELATED APPLICATIONS

This application claims the benefit of the Korean Patent Application No. 10-2016-0125616 filed on Sep. 29, 2016.

BACKGROUND

Field of the Invention

The present disclosure relates to an organic light emitting display panel and an organic light emitting display device including the same.

Discussion of the Related Art

Flat panel display (FPD) devices are applied to various kinds of electronic products such as portable phones, tablet personal computers (PCs), notebook computers, etc. Examples of the FPD devices include liquid crystal display (LCD) devices, organic light emitting display devices, etc. Recently, electrophoretic display (EPD) devices are being used as one type of FPD device.

In FPD devices (hereinafter simply referred to as a display device), the organic light emitting display devices have a fast response time of 1 ms or less and low power consumption, and thus are attracting attention as next generation display devices.

FIG. 1 is an exemplary diagram illustrating a turn-on test process performed for determining whether a related art organic light emitting display panel is normal or not.

Due to various causes occurring in a process of manufacturing an organic light emitting display panel, anodes of two adjacent subpixels may be electrically connected to each other, and in this case, the two adjacent subpixels may be simultaneously turned on.

For example, one unit pixel includes a red subpixel R, a white subpixel W, a blue subpixel B, and a green subpixel G which are sequentially arranged. In a case where an anode of the blue subpixel B and an anode of the white subpixel W are electrically connected to each other, as illustrated in FIG. 1 (a), when the blue subpixel B is turned on, the white subpixel W is also turned on, and as illustrated in FIG. 1 (b), when the white subpixel W is turned on, the blue subpixel B is also turned on.

Since a luminance of the blue subpixel B is low, a turn-on state illustrated in FIG. 1 (b) is not determined as a defect. However, since a luminance of the white subpixel W is high, a turn-on state illustrated in FIG. 1 (a) is determined as a defect. As a result, an organic light emitting display panel where the anode of the blue subpixel B and the anode of the white subpixel W are electrically connected to each other is determined as a defect.

Moreover, one unit pixel includes a red subpixel R, a white subpixel W, a blue subpixel B, and a green subpixel G which are sequentially arranged. In a case where an anode of the red subpixel R and an anode of the white subpixel W are electrically connected to each other, as illustrated in FIG. 1 (c), when the red subpixel R is turned on, the white subpixel W is also turned on, and as illustrated in FIG. 1 (d), when the white subpixel W is turned on, the red subpixel R is also turned on.

Since a luminance of the red subpixel R is low, a turn-on state illustrated in FIG. 1 (d) is not determined as a defect. However, since a luminance of the white subpixel W is high, a turn-on state illustrated in FIG. 1 (c) is determined as a defect. As a result, an organic light emitting display panel where the anode of the red subpixel R and the anode of the white subpixel W are electrically connected to each other is determined as a defect.

As described above, an organic light emitting display panel where the blue subpixel and the white subpixel are simultaneously turned on or the red subpixel and the white subpixel are simultaneously turned on is determined as a defect, and for this reason, a defect rate of the organic light emitting display panel increases.

Even when an anode of the green subpixel G and the anode of the white subpixel W are electrically connected to each other, the above-described defect can occur, and for this reason, a defect rate of the organic light emitting display panel can increase.

SUMMARY

Accordingly, the present disclosure is directed to provide an organic light emitting display panel and an organic light emitting display device including the same that substantially reduces one or more problems due to limitations and disadvantages of the related art.

An aspect of the present disclosure is directed to provide an organic light emitting display panel and an organic light emitting display device including the same, in which a pixel driving circuit of a subpixel, sharing an anode with a white subpixel, of subpixels configuring a unit pixel is disconnected from the outside of the subpixel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display panel including a plurality of gate lines, a plurality of data lines, and a plurality of subpixels defined by the plurality of gate lines and the plurality of data lines. The plurality of subpixels may each include an organic light emitting diode and a pixel driving circuit driving the organic light emitting diode. First to fourth subpixels, which are adjacent to one another may define a unit pixel. The first subpixel of the first to fourth subpixels may be a white subpixel. An anode of the second subpixel may be connected to an anode of the first subpixel. At least one of a plurality of lines configuring a pixel driving circuit of the second subpixel may be cut.

In another aspect of the present disclosure, there is provided an organic light emitting display device including an organic light emitting display panel and a driver driving the organic light emitting display panel. The organic light emitting display panel may include a plurality of gate lines, a plurality of data lines, and a plurality of subpixels defined by the plurality of gate lines and the plurality of data lines. The plurality of subpixels may each include an organic light emitting diode and a pixel driving circuit driving the organic light emitting diode. First to fourth subpixels, which are adjacent to one another may define a unit pixel. The first subpixel of the first to fourth subpixels may be a white subpixel. An anode of the second subpixel may be connected to an anode of the first subpixel. At least one of a plurality of lines configuring a pixel driving circuit of the second subpixel may be cut.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
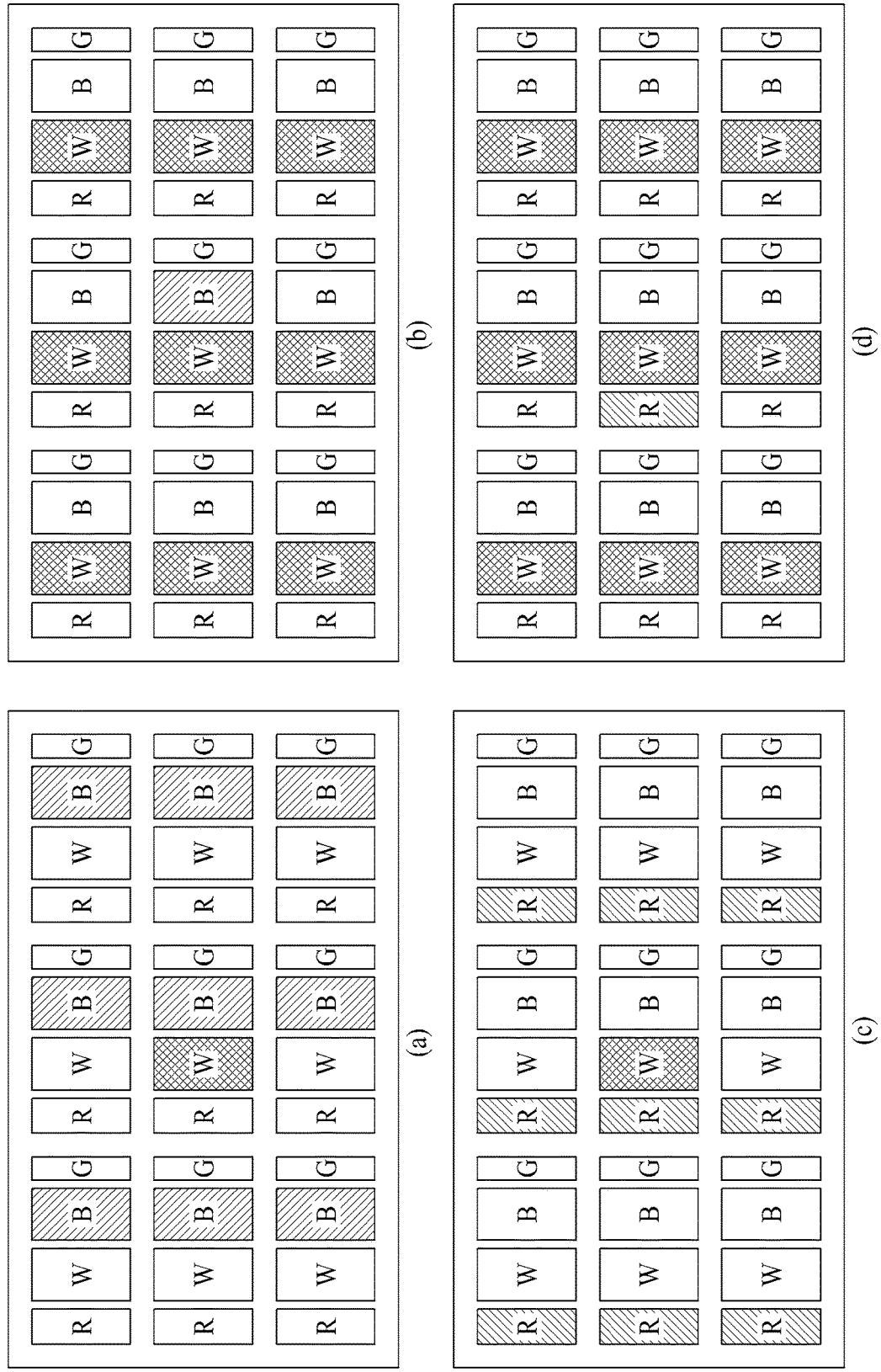
FIG. 1 is a diagram illustrating a turn-on test process performed for determining whether an organic light emitting display panel is normal or not.

Reference will now be made in detail to the various embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Furthermore, the present disclosure is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
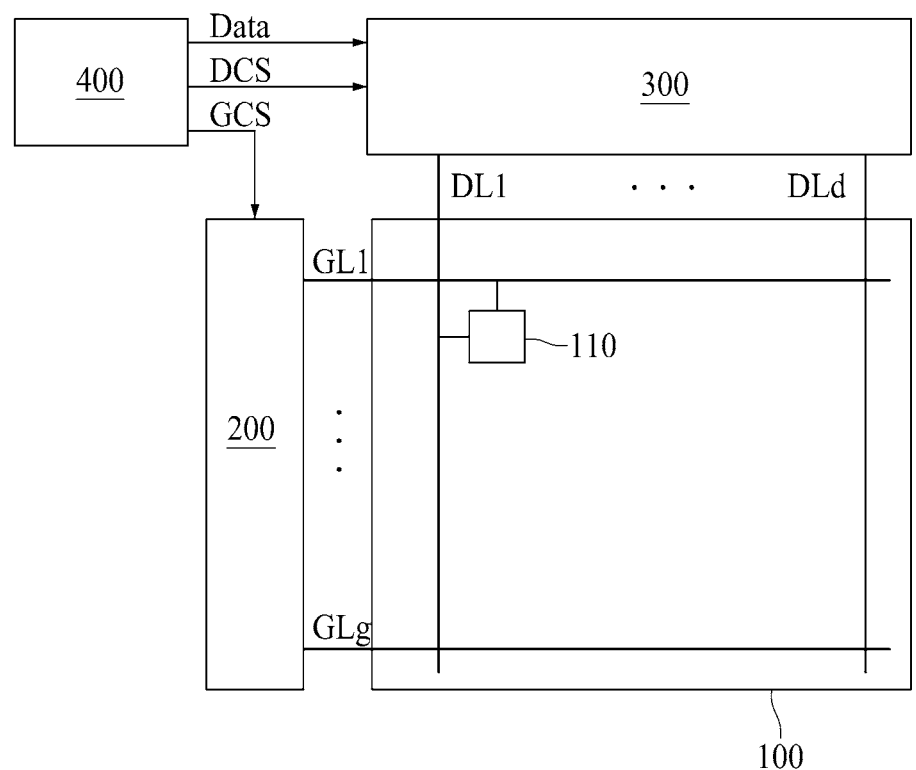
FIG. 2 is a diagram illustrating a configuration of an organic light emitting display device, according to an embodiment of the present disclosure.
Figure 3:
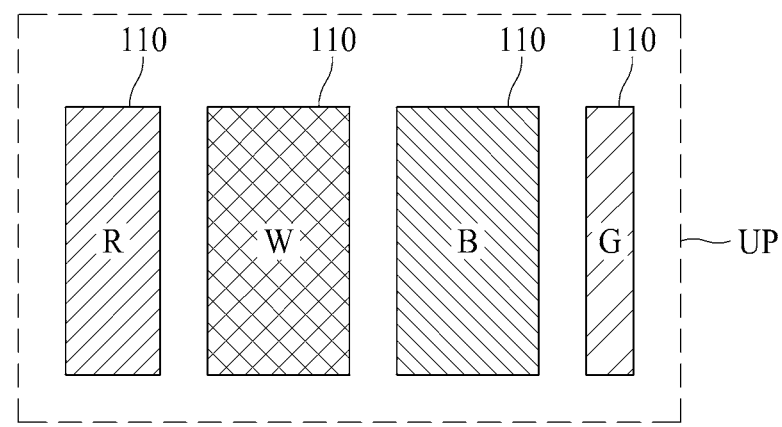
FIG. 3 is a diagram illustrating a configuration of a unit pixel included in an organic light emitting display panel, according to an embodiment of the present disclosure.

FIG. 2 is a diagram illustrating a configuration of an organic light emitting display device, according to an embodiment of the present disclosure, and FIG. 3 is a diagram illustrating a configuration of a unit pixel included in an organic light emitting display panel, according to an embodiment of the present disclosure.

The organic light emitting display device, as illustrated in FIG. 2, may include an organic light emitting display panel 100 and a driver that drives the organic light emitting display panel 100 according to an embodiment of the disclosure.

The organic light emitting display panel 100 may include a plurality of gate lines GL1 to GLg, a plurality of data lines DL1 to DLd, and a plurality of subpixels 110 defined by the gate lines GL1 to GLg and the data lines DL1 to DLd.

The subpixels 110 may each include an organic light emitting diode and a pixel driving circuit that drives the organic light emitting diode.

First to fourth subpixels 110, which are adjacent to one another, of the plurality of subpixels may configure a unit pixel UP.

For example, as illustrated in FIG. 3, the unit pixel UP may include four subpixels.

The first subpixel of the first to fourth subpixels may be a white subpixel. In this case, an anode of the second subpixel may be connected to an anode of the first subpixel, and at least one of lines configuring a pixel driving circuit of the second subpixel may be cut.

For example, in FIG. 3, if the first subpixel is a white subpixel W, the second subpixel may be a red subpixel R. In this case, an anode of the red subpixel R may be connected to an anode of the white subpixel W, and at least one of lines configuring a pixel driving circuit of the red subpixel R may be cut.

Moreover, in FIG. 3, if the first subpixel is a white subpixel W, the second subpixel may be a blue subpixel B. In this case, an anode of the blue subpixel B may be connected to an anode of the white subpixel W, and at least one of lines configuring a pixel driving circuit of the blue subpixel B may be cut.

The driver may supply gate pulses to the gate lines GL1 to GLg, supply data voltages to the data lines DL1 to DLd, and supply a voltage and a current to the organic light emitting diode.

For example, the driver may include a gate driver 200 that supplies the gate pulses to the gate lines GL1 to GLg, a data driver 300 that supplies the data voltages to the data lines DL1 to DLd, and a controller 400 that controls the gate driver 200 and the data driver 300.

The controller 400 may convert video data input from an external system into image data Data, based on a structure of the organic light emitting display panel 100 and may transfer the image data Data to the data driver 300. Also, the controller 400 may generate a data control signal DCS for driving of the data driver 300 and may transfer the data control signal DCS to the data driver 300. The data driver 300 may convert the image data Data into data voltages according to the data control signal DCS and may supply the data voltages to the data lines DL1 to DLd.

The controller 400 may generate a gate control signal GCS for driving of the gate driver 200 and may transfer the gate control signal GCS to the gate driver 200. The gate driver 200 may supply the gate pulses to the gate lines GL1 to GLg according to the gate control signal GCS.

As described above, in a case where the unit pixel UP includes the white subpixel W, the blue subpixel B, the red subpixel R, and the green subpixel G, the first subpixel may be the white subpixel W, and the second subpixel may be one of the subpixel B, the red subpixel R, and the green subpixel G.

Moreover, arrangement positions of the subpixels may be variously changed.

For example, the first to fourth subpixels may be arranged in the order of the first subpixel, the second subpixel, the third subpixel, and the fourth subpixel, arranged in the order of the second subpixel, the first subpixel, the third subpixel, and the fourth subpixel, arranged in the order of the third subpixel, the first subpixel, the second subpixel, and the fourth subpixel, arranged in the order of the fourth subpixel, the first subpixel, the second subpixel, and the third subpixel, arranged in the order of the fourth subpixel, the second subpixel, the first subpixel, and the third subpixel, arranged in the order of the fourth subpixel, the third subpixel, the second subpixel, and the first subpixel, or arranged in the order of the fourth subpixel, the third subpixel, the first subpixel, and the second subpixel.

In the above-described various arrangement structures, the first subpixel and the second subpixel should necessarily be adjacent to each other. FIG. 3 illustrates the unit pixel UP where the second subpixel, the first subpixel, the third subpixel, and the fourth subpixel are sequentially arranged. Here, the second subpixel may be a red subpixel R, the first subpixel may be a white subpixel W, the third subpixel may be a blue subpixel B, and the fourth subpixel may be a green subpixel G.

Figure 4:
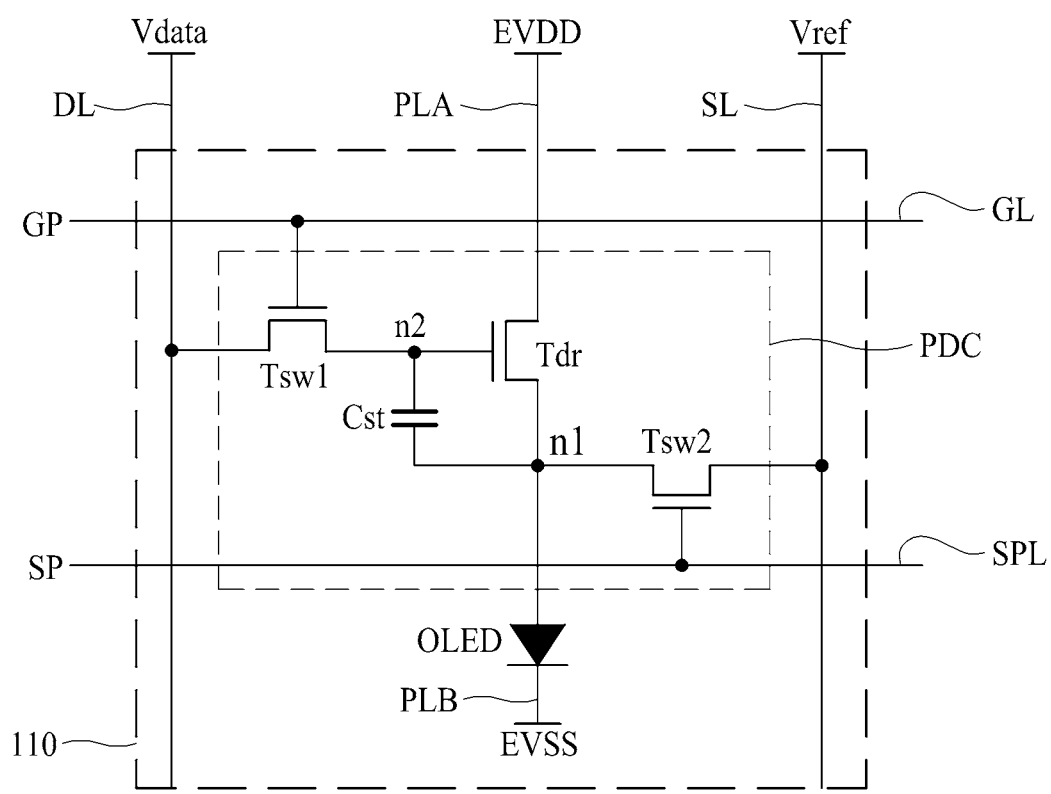
FIG. 4 is a diagram illustrating a configuration of each of subpixels included in an organic light emitting display panel, according to an embodiment of the present disclosure.

FIG. 4 is a diagram illustrating a configuration of each of subpixels included in an organic light emitting display panel 100, according to an embodiment of the present disclosure.

The organic light emitting display panel, as described above with reference to FIGS. 2 and 3, may include the gate lines GL1 to GLg, the data lines DL1 to DLd, and the subpixels 110 defined by the gate lines GL1 to GLg and the data lines DL1 to DLd.

Each of the subpixels 110, as illustrated in FIG. 4, may include an organic light emitting diode OLED and a pixel driving circuit PDC that drives the organic light emitting diode OLED. A plurality of signal lines DL, GL, PLA, PLB, SL, and SPL for supplying a plurality of driving signals to the pixel driving circuit PDC may be provided in each of the subpixels 110.

A data voltage may be supplied through a data line DL, a gate pulse may be supplied through a gate line GL, a first driving power EVDD may be supplied through a power supply line PLA, a second driving power EVSS may be supplied through a driving power line PLB, a reference voltage Vref may be supplied through a sensing line SL, and a sensing pulse SP for turning on/off a sensing transistor Tsw2 may be supplied through a sensing pulse line SPL.

For example, as illustrated in FIG. 4, the pixel driving circuit PDC may include a switching transistor Tsw1 that is connected to the gate line GL and the data line DL, an organic light emitting diode OLED that emits light, a driving transistor Tdr that controls a level of a current output to the organic light emitting diode OLED according to a data voltage Vdata transferred through the switching transistor Tsw1, and a sensing transistor Tsw2.

The sensing transistor Tsw2 may be connected to the sensing line SL and a first node n1 between the driving transistor Tdr and the organic light emitting diode OLED and may be turned on/off by a sensing pulse SP. In a sensing period, the sensing transistor Tsw2 may sense a characteristic of the driving transistor Tdr.

A second node n2 connected to a gate of the driving transistor may be connected to the switching transistor Tsw1. A storage capacitor Cst may be provided between the second node n2 and the first node n1.

In addition to the structure illustrated in FIG. 4, the pixel driving circuit PDC may be configured in various structures. Also, FIG. 4 is a diagram illustrating a configuration of a subpixel 110 which does not share an anode with another subpixel adjacent thereto. A subpixel which shares an anode with another subpixel adjacent thereto will be described below with reference to FIGS. 5 and 6.

Figure 5:
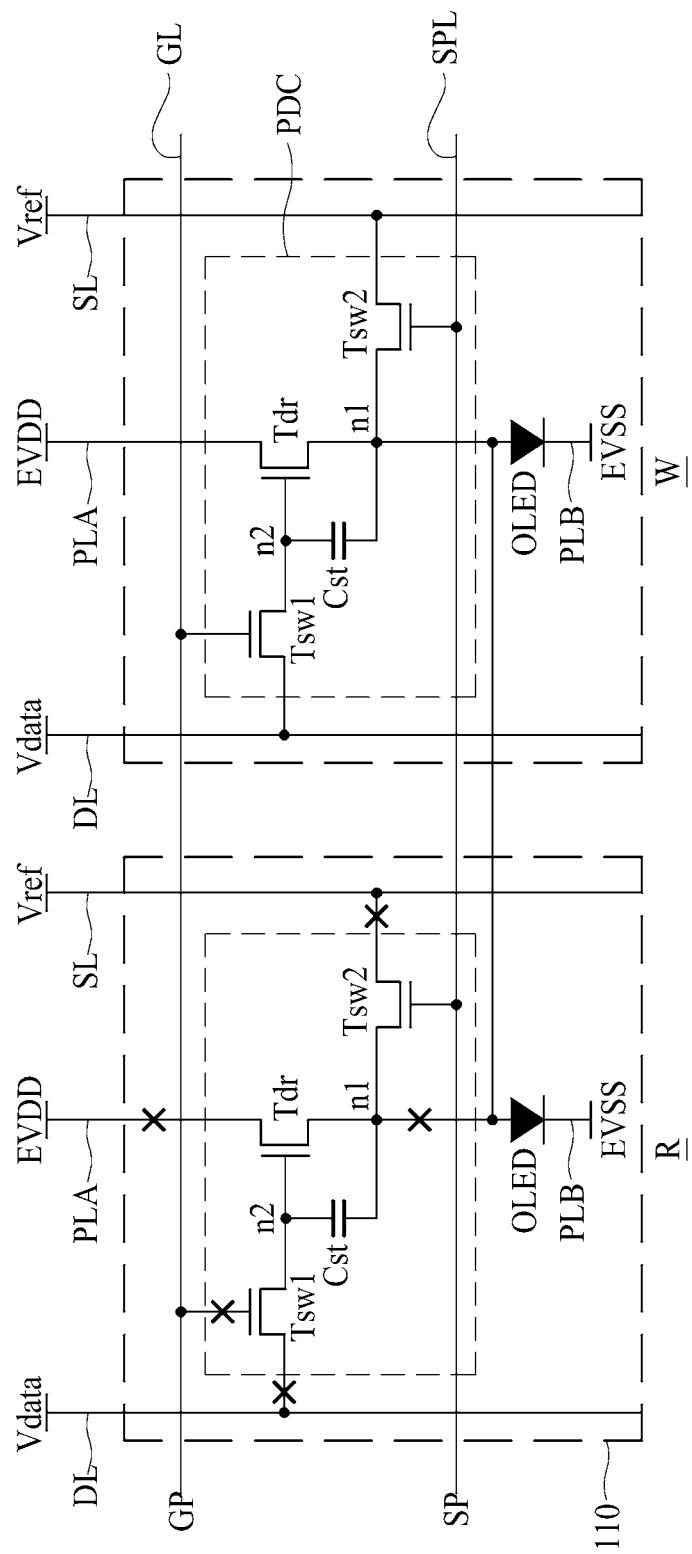
FIG. 5 is a diagram illustrating a red subpixel and a white subpixel, which are included in an organic light emitting display panel, share an anode, according to an embodiment of the present disclosure.

FIG. 5 is a diagram illustrating a red subpixel and a white subpixel, which are included in an organic light emitting display panel 100, share an anode, according to an embodiment of the present disclosure. In the description below, details which are the same as or similar to the details described above with reference to FIGS. 2 to 4 are omitted or will be briefly described.

As described above, the organic light emitting display panel 100 may include the gate lines GL1 to GLg, the data lines DL1 to DLd, and a plurality of subpixels 110 defined by the gate lines GL1 to GLg and the data lines DL1 to DLd.

Each of the subpixels 110 may include the organic light emitting diode OLED and the pixel driving circuit PDC that drives the organic light emitting diode OLED.

First to fourth subpixels, which are adjacent to one another, of the subpixels 110 may configure a unit pixel UP as illustrated in FIG. 3.

For example, as illustrated in FIG. 3, the unit pixel UP may include four subpixels.

The first subpixel of the first to fourth subpixels may be a white subpixel. In this case, an anode of the second subpixel may be connected to an anode of the first subpixel, and at least one of lines configuring a pixel driving circuit of the second subpixel may be cut.

For example, as illustrated in FIG. 5, if the first subpixel is a white subpixel W, the second subpixel may be a red subpixel R. In this case, an anode of an organic light emitting diode OLED included in the red subpixel R may be connected to an anode of an organic light emitting diode OLED included in the white subpixel W.

The pixel driving circuit PDC of the second subpixel (i.e., the red subpixel R) may include a switching transistor Tsw1, connected to one gate line GL of the gate lines GL1 to GLg and one data line DL of the data lines DL1 to DLd, and a driving transistor Tdr that controls a level of a current output to the organic light emitting diode OLED according to a data voltage transferred through the switching transistor Tsw1.

In this case, at least one of lines configuring the pixel driving circuit PDC of the red subpixel R may be cut. For example, at least one of the gate line GL connected to the switching transistor Tsw1, the data line DL connected to the switching transistor Tsw1, and a power supply line PLA connecting the driving transistor Tdr to the anode of the organic light emitting diode OLED may be cut.

However, as described above with reference to FIG. 4, the red subpixel R may include various elements in addition to the switching transistor Tsw1 and the driving transistor Tdr. For example, in the red subpixel R, as illustrated in FIG. 5, the gate line GL, the data line DL, the sensing line SL, and the power supply line PLA connecting the driving transistor Tdr to the anode of the organic light emitting diode OLED may configure the pixel driving circuit PDC and may all be cut.

However, in the red subpixel R, only at least one of the gate line GL, the data line DL, the sensing line SL, and the power supply line PLA which configure the pixel driving circuit PDC may be cut, and the power supply line PLA may connect the driving transistor Tdr to the anode of the organic light emitting diode OLED.

As described above, when it is assumed that the red subpixel R and the white subpixel W which share an anode configure a red sharing pixel, one or more red sharing pixels may be included in the organic light emitting display panel according to an embodiment of the present disclosure.

Figure 6:
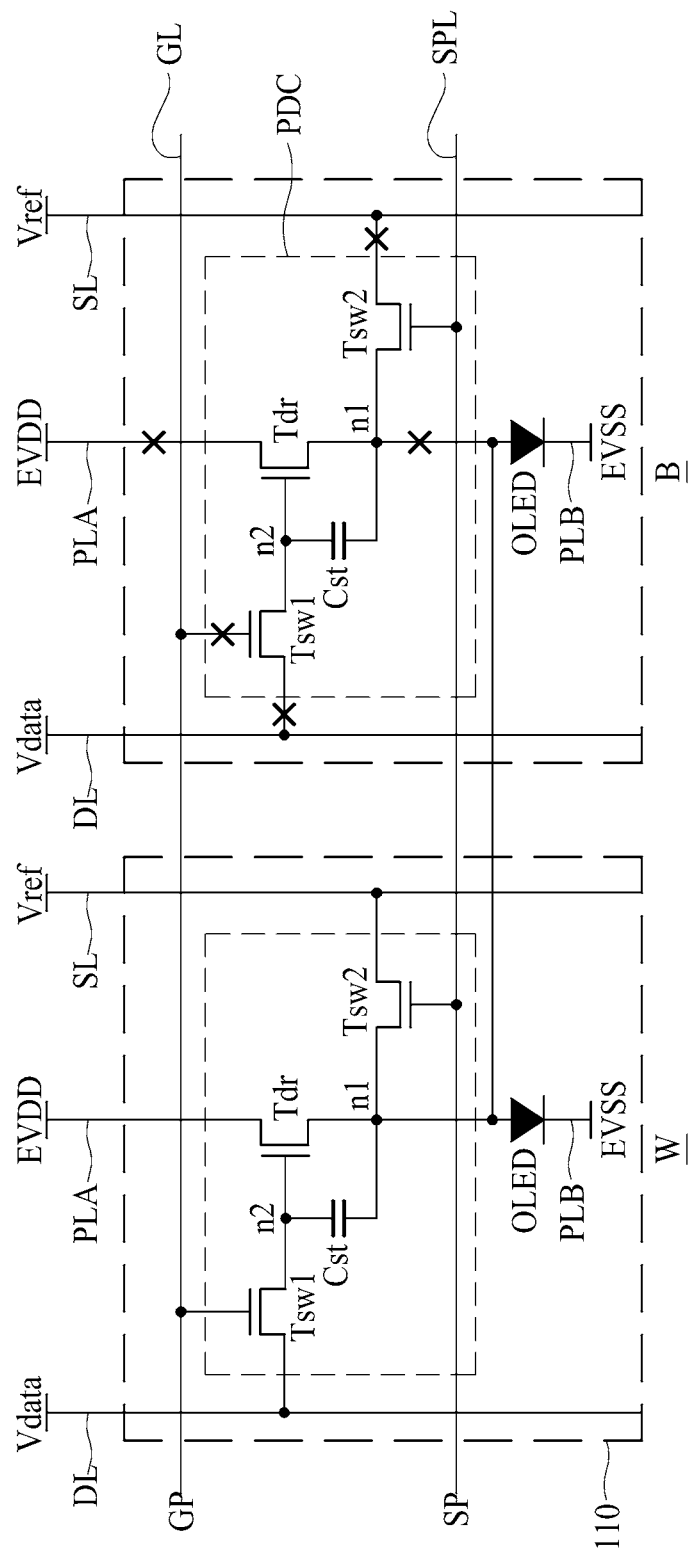
FIG. 6 is a diagram illustrating a blue subpixel and a white subpixel, which are included in an organic light emitting display panel, share an anode, according to an embodiment of the present disclosure.

FIG. 6 is an exemplary diagram illustrating a blue subpixel and a white subpixel, which are included in an organic light emitting display panel 100, share an anode, according to an embodiment of the present disclosure. In the description below, details which are the same as or similar to the details described above with reference to FIGS. 2 to 4 are omitted or will be briefly described.

As described above, the organic light emitting display panel 100 may include the gate lines GL1 to GLg, the data lines DL1 to DLd, and a plurality of subpixels 110 defined by the gate lines GL1 to GLg and the data lines DL1 to DLd.

Each of the subpixels 110 may include the organic light emitting diode OLED and the pixel driving circuit PDC that drives the organic light emitting diode OLED.

First to fourth subpixels, which are adjacent to one another, of the subpixels 110 may configure a unit pixel UP as illustrated in FIG. 3.

For example, as illustrated in FIG. 3, the unit pixel UP may include four subpixels.

The first subpixel of the first to fourth subpixels may be a white subpixel. In this case, an anode of the second subpixel may be connected to an anode of the first subpixel, and at least one of lines configuring a pixel driving circuit of the second subpixel may be cut.

For example, as illustrated in FIG. 6, if the first subpixel is a white subpixel W, the second subpixel may be a blue subpixel B. In this case, an anode of an organic light emitting diode OLED included in the blue subpixel B may be connected to an anode of an organic light emitting diode OLED included in the white subpixel W.

The pixel driving circuit PDC of the second subpixel (i.e., the blue subpixel B) may include a switching transistor Tsw1, connected to one gate line GL of the gate lines GL1 to GLg and one data line DL of the data lines DL1 to DLd, and a driving transistor Tdr that controls a level of a current output to the organic light emitting diode OLED according to a data voltage transferred through the switching transistor Tsw1.

In this case, at least one of lines configuring the pixel driving circuit PDC of the blue subpixel B may be cut. For example, at least one of the gate line GL connected to the switching transistor Tsw1, the data line DL connected to the switching transistor Tsw1, and a power supply line PLA connecting the driving transistor Tdr to the anode of the organic light emitting diode OLED may be cut.

However, as described above with reference to FIG. 4, the blue subpixel B may include various elements in addition to the switching transistor Tsw1 and the driving transistor Tdr. For example, the blue subpixel B may be configured as illustrated in FIG. 6, and in this case, the gate line GL, the data line DL, the sensing line SL, and the power supply line PLA connecting the driving transistor Tdr to the anode of the organic light emitting diode OLED may configure the pixel driving circuit PDC and may all be cut.

However, in the blue subpixel B, only at least one of the gate line GL, the data line DL, the sensing line SL, and the power supply line PLA which configure the pixel driving circuit PDC may be cut, and the power supply line PLA may connect the driving transistor Tdr to the anode of the organic light emitting diode OLED.

As described above, when it is assumed that the blue subpixel B and the white subpixel W which share an anode configure a blue sharing pixel, one or more blue sharing pixels may be included in the organic light emitting display panel according to an embodiment of the present disclosure.

Moreover, when it is assumed that the green subpixel G and the white subpixel W which share an anode configure a green sharing pixel, one or more green sharing pixels may be included in the organic light emitting display panel according to an embodiment of the present disclosure.

A generic name for the red sharing pixel, the blue sharing pixel, and the green sharing pixel may be a sharing pixel. Therefore, the sharing pixel may be the red sharing pixel, the blue sharing pixel, or the green sharing pixel.

The organic light emitting display panel according to an embodiment of the present disclosure may include at least one sharing pixel.

Figure 7:
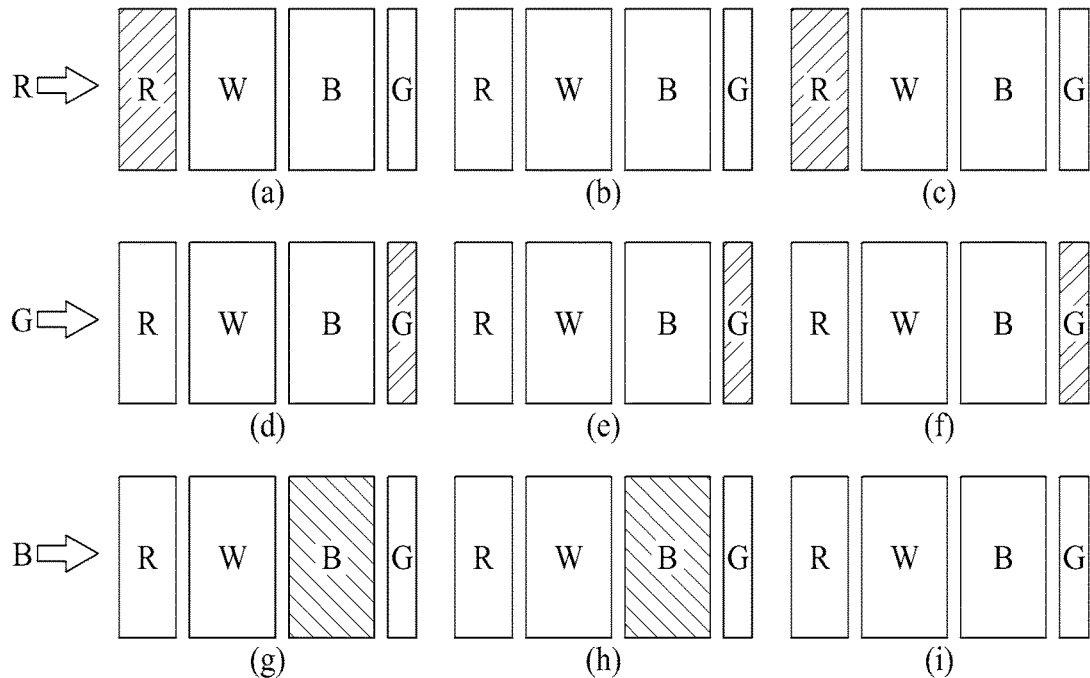
FIG. 7 is a diagram for describing a feature of an organic light emitting display device, according to an embodiment of the present disclosure.

FIG. 7 is a diagram for describing a feature of an organic light emitting display device, according to an embodiment of the present disclosure.

Particularly, FIG. 7 is a diagram illustrating a turn-on state of the organic light emitting display panel when the red subpixels R, the green subpixels G, and the blue subpixels B of the organic light emitting display panel are sequentially driven.

FIG. 7 (a), FIG. 7 (d), and FIG. 7 (g) are diagrams illustrating a turn-on state of a general organic light emitting display panel where there are no subpixels sharing an anode, FIG. 7 (b), FIG. 7 (e), and FIG. 7 (h) are diagrams illustrating a turn-on state of an organic light emitting display panel where a red subpixel R and a white subpixel W share an anode as illustrated in FIG. 5, and FIG. 7 (c), FIG. 7 (f), and FIG. 7 (i) are diagrams illustrating a turn-on state of an organic light emitting display panel where a blue subpixel B and a white subpixel W share an anode as illustrated in FIG. 6.

In the general organic light emitting display panel, when the red subpixel R is driven, as illustrated in FIG. 7 (a), only the red subpixel R may be turned on, and the white subpixel W, blue subpixel B, and green subpixel G may not be turned on.

In the general organic light emitting display panel, when the green subpixel G is driven, as illustrated in FIG. 7 (d), only the green subpixel G may be turned on, and the red subpixel R, white subpixel W, and blue subpixel B may not be turned on.

In the general organic light emitting display panel, when the blue subpixel B is driven, as illustrated in FIG. 7 (g), only the blue subpixel B may be turned on, and the red subpixel R, white subpixel W, and green subpixel G may not be turned on.

In the general organic light emitting display panel, as described above, each of the subpixels is normally turned on.

In the organic light emitting display panel where the red subpixel R and the white subpixel W share an anode as illustrated in FIG. 5, when the red subpixel R is driven, since at least one of lines configuring the pixel driving circuit PDC of the red subpixel R is cut, as illustrated in FIG. 7 (b), the red subpixel R may not be turned on, and moreover, the white subpixel W, blue subpixel B, and green subpixel G may not be turned on.

In the organic light emitting display panel where the red subpixel R and the white subpixel W share the anode as illustrated in FIG. 5, when the green subpixel G is driven, as illustrated in FIG. 7 (e), only the green subpixel G may be turned on, and the red subpixel R, white subpixel W, and blue subpixel B may not be turned on.

In the organic light emitting display panel where the red subpixel R and the white subpixel W share the anode as illustrated in FIG. 5, when the blue subpixel B is driven, as illustrated in FIG. 7 (h), only the blue subpixel B may be turned on, and the red subpixel R, white subpixel W, and green subpixel G may not be turned on.

As described above, in the organic light emitting display panel where the red subpixel R and the white subpixel W share the anode, the red subpixel R is not turned on at a time when the red subpixel R should be turned on. However, since a luminance of the red subpixel R is not high, the organic light emitting display panel where the red subpixel R and the white subpixel W share the anode may be classified as a normal panel and may be used.

In the organic light emitting display panel where the blue subpixel B and the white subpixel W share the anode as illustrated in FIG. 6, when only the red subpixel R is driven, as illustrated in FIG. 7 (c), the red subpixel R may be turned on, and the white subpixel W, blue subpixel B, and green subpixel G may not be turned on.

In the organic light emitting display panel where the blue subpixel B and the white subpixel W share the anode as illustrated in FIG. 6, when the green subpixel G is driven, as illustrated in FIG. 7 (f), only the green subpixel G may be turned on, and the red subpixel R, white subpixel W, and blue subpixel B may not be turned on.

In the organic light emitting display panel where the blue subpixel B and the white subpixel W share the anode as illustrated in FIG. 6, when the blue subpixel B is driven, since at least one of lines configuring the pixel driving circuit PDC of the blue subpixel B is cut, as illustrated in FIG. 7 (i), the blue subpixel B may not be turned on, and the red subpixel R, white subpixel W, and green subpixel G may also not be turned on.

As described above, in the organic light emitting display panel where the blue subpixel B and the white subpixel W share the anode, the blue subpixel B is not turned on at a time when the blue subpixel B should be turned on. However, since a luminance of the blue subpixel B is not high, the organic light emitting display panel where the blue subpixel B and the white subpixel W share the anode may be classified as a normal panel and may be used.

For the above-described reason, the organic light emitting display panel where the green subpixel G and the white subpixel W share an anode may be classified as a normal panel and may be used too.

Figure 8:
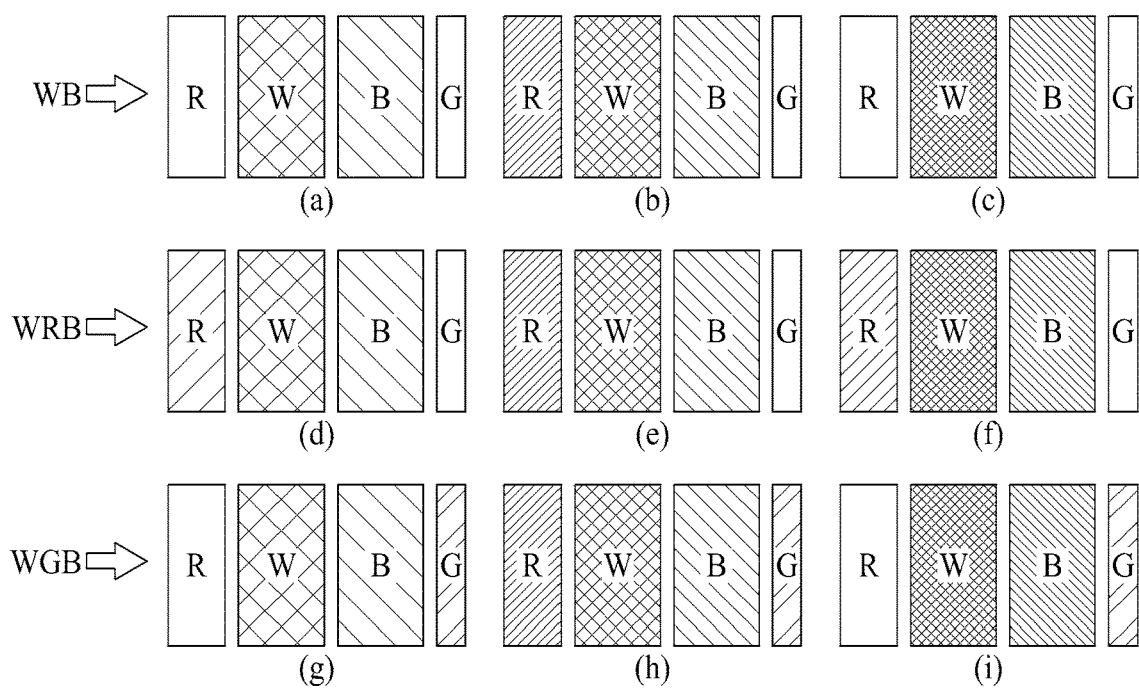
FIG. 8 is a diagram for describing a feature of an organic light emitting display device, according to another embodiment of the present disclosure.

FIG. 8 is a diagram for describing a feature of an organic light emitting display device, according to another embodiment of the present disclosure.

Particularly, FIG. 8 is an exemplary diagram illustrating a turn-on state of the organic light emitting display panel when at least two of the red subpixels R, the green subpixels G, and the blue subpixels B of the organic light emitting display panel are simultaneously driven.

FIG. 8 (a), FIG. 8 (d), and FIG. 8 (g) are diagrams illustrating a turn-on state of a general organic light emitting display panel where there are no subpixels sharing an anode, FIG. 8 (b), FIG. 8 (e), and FIG. 8 (h) are diagrams illustrating a turn-on state of an organic light emitting display panel where a red subpixel R and a white subpixel W share an anode as illustrated in FIG. 5, and FIG. 8 (c), FIG. 8 (f), and FIG. 8 (i) are diagrams illustrating a turn-on state of an organic light emitting display panel where a blue subpixel B and a white subpixel W share an anode as illustrated in FIG. 6.

In the general organic light emitting display panel, when the white subpixel W and the blue subpixel B are simultaneously driven, as illustrated in FIG. 8 (a), only the white subpixel W and the blue subpixel B may be turned on, and the red subpixel R and white subpixel W may not be turned on.

In the general organic light emitting display panel, when the red subpixel R, the white subpixel W, and the blue subpixel B are simultaneously driven, as illustrated in FIG. 8 (d), only the red subpixel R, the white subpixel W, and the blue subpixel B may be turned on, and the green subpixel G may not be turned on.

In the general organic light emitting display panel, when the white subpixel W, the blue subpixel B, and the green subpixel G are simultaneously driven, as illustrated in FIG. 8 (g), only the white subpixel W, the blue subpixel B, and the green subpixel G may be turned on, and the red subpixel R may not be turned on.

In the general organic light emitting display panel, as described above, each of the subpixels is normally turned on.

In the organic light emitting display panel where the red subpixel R and the white subpixel W share an anode as illustrated in FIG. 5, when the white subpixel W and the blue subpixel B are simultaneously driven, since at least one of lines configuring the pixel driving circuit PDC of the red subpixel R is cut but the anode of the red subpixel R is shared by the white subpixel W, as illustrated in FIG. 8 (b), the red subpixel R, the white subpixel W, and the blue subpixel B may be turned on, and the green subpixel G may not be turned on. In this case, a luminance of the red subpixel R is not high. Also, a luminance of the white subpixel W is reduced by about 35% in comparison with a case where the white subpixel W does not share the anode with the red subpixel R, but the reduction in luminance is hardly recognized by eyes of a user. Accordingly, the organic light emitting display panel may be normally used.

In the organic light emitting display panel where the red subpixel R and the white subpixel W share the anode as illustrated in FIG. 5, when the red subpixel R, the white subpixel W, and the blue subpixel B are simultaneously driven, as illustrated in FIG. 8 (e), only the red subpixel R, the white subpixel W, and the blue subpixel B may be turned on, and the green subpixel G may not be turned on. Since at least one of the lines configuring the pixel driving circuit PDC of the red subpixel R is cut but the anode of the red subpixel R is shared by the white subpixel W, the red subpixel R may be substantially turned on by the white subpixel W. In this case, a reduction amount of luminance of the red subpixel R is not high. Also, a luminance of the white subpixel W is reduced by about 35% in comparison with a case where the white subpixel W does not share the anode with the red subpixel R, but the reduction in luminance is hardly recognized by eyes of a user. Accordingly, the organic light emitting display panel may be normally used.

In the organic light emitting display panel where the red subpixel R and the white subpixel W share the anode as illustrated in FIG. 5, when the white subpixel W, the blue subpixel B, and the green subpixel G are simultaneously driven, as illustrated in FIG. 8 (h), the red subpixel R, the white subpixel W, the blue subpixel B, and the green subpixel G may all be turned on. Since at least one of the lines configuring the pixel driving circuit PDC of the red subpixel R is cut but the anode of the red subpixel R is shared by the white subpixel W, the red subpixel R may be substantially turned on by the white subpixel W. In this case, a luminance of the red subpixel R is not high. Also, a luminance of the white subpixel W is reduced by about 35% in comparison with a case where the white subpixel W does not share the anode with the red subpixel R, but the reduction in luminance is hardly recognized by eyes of a user. Accordingly, the organic light emitting display panel may be normally used.

As described above, in the organic light emitting display panel where the red subpixel R and the white subpixel W share the anode, when the red subpixel R and the white subpixel W are simultaneously turned on, a luminance of the red subpixel R and a luminance of the white subpixel W are all reduced. However, a reduction amount of luminance is not high, and thus, the organic light emitting display panel where the red subpixel R and the white subpixel W share the anode may be normally used.

In the organic light emitting display panel where the blue subpixel B and the white subpixel W share the anode as illustrated in FIG. 6, when the white subpixel W and the blue subpixel B are simultaneously driven, as illustrated in FIG. 8 (c), the white subpixel W and the blue subpixel B may be turned on, and the red subpixel R and green subpixel G may not be turned on. Since at least one of lines configuring the pixel driving circuit PDC of the blue subpixel B is cut but the anode of the blue subpixel B is shared by the white subpixel W, the blue subpixel B may be substantially turned on by the white subpixel W. In this case, a reduction amount of luminance of the blue subpixel B is not high. Also, a luminance of the white subpixel W is reduced by about 50% in comparison with a case where the white subpixel W does not share the anode with the blue subpixel B, but the reduction in luminance is hardly recognized by eyes of a user. Accordingly, the organic light emitting display panel may be normally used.

In the organic light emitting display panel where the blue subpixel B and the white subpixel W share the anode as illustrated in FIG. 6, when the red subpixel R, the white subpixel W, and the blue subpixel B are simultaneously driven, as illustrated in FIG. 8 (f), only the red subpixel R, the white subpixel W, and the blue subpixel B may be turned on, and the other green subpixel G may not be turned on. Since at least one of the lines configuring the pixel driving circuit PDC of the blue subpixel B is cut but the anode of the blue subpixel B is shared by the white subpixel W, the blue subpixel B may be substantially turned on by the white subpixel W. In this case, a reduction amount of luminance of the blue subpixel B is not high. Also, a luminance of the white subpixel W is reduced by about 50% in comparison with a case where the white subpixel W does not share the anode with the blue subpixel B, but the reduction in luminance is hardly recognized by eyes of a user. Accordingly, the organic light emitting display panel may be normally used.

In the organic light emitting display panel where the blue subpixel B and the white subpixel W share the anode as illustrated in FIG. 6, when the white subpixel W, the blue subpixel B, and the green subpixel G are simultaneously driven, only the white subpixel W, the blue subpixel B, and the green subpixel G may be turned on, and the red subpixel R may not be turned on. Since at least one of the lines configuring the pixel driving circuit PDC of the blue subpixel B is cut but the anode of the blue subpixel B is shared by the white subpixel W, the blue subpixel B may be substantially turned on by the white subpixel W. In this case, a reduction amount of luminance of the blue subpixel B is not high. Also, a luminance of the white subpixel W is reduced by about 50% in comparison with a case where the white subpixel W does not share the anode with the blue subpixel B, but the reduction in luminance is hardly recognized by eyes of a user. Accordingly, the organic light emitting display panel may be normally used.

As described above, in the organic light emitting display panel where the blue subpixel B and the white subpixel W share the anode, when the blue subpixel B and the white subpixel W are simultaneously turned on, a luminance of the blue subpixel B and a luminance of the white subpixel W are all reduced. However, a reduction amount of luminance is not high, and thus, the organic light emitting display panel where the blue subpixel B and the white subpixel W share the anode may be normally used.

For the above-described reason, the organic light emitting display panel where the green subpixel G and the white subpixel W share an anode may be normally used too.

As described above, according to the embodiments of the present disclosure, an organic light emitting display panel where a red subpixel and a white subpixel adjacent to each other are simultaneously turned on or an organic light emitting display panel where a blue subpixel and a white subpixel adjacent to each other are simultaneously turned on may be determined as a normal panel and may be used.

Therefore, a defect rate of the organic light emitting display panel is reduced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display panel comprising:
    a plurality of gate lines, each gate line of the plurality of gate lines connected to a gate terminal of multiple switching transistors, the gate lines for supplying gate pulses to the switching transistors;
    a plurality of data lines, each data line of the plurality of data lines connected to multiple switching transistors, the data line for providing data voltages to be transferred to driving transistors through the switching transistors according to the gate pulses supplied through the plurality of gate lines; and
    a plurality of subpixels defined by the plurality of gate lines and the plurality of data lines,
    wherein:
        each subpixel of the plurality of subpixels comprises an organic light emitting diode (OLED) and a pixel driving circuit driving the organic light emitting diode,
        a first subpixel, a second subpixel, a third subpixel, and a fourth subpixel adjacent to one another define a unit pixel,
        the first subpixel is a white subpixel, and
        the pixel driving circuit of the second subpixel is directly connected to the pixel driving circuit of the first subpixel, the second subpixel defined by a second subpixel gate line from the plurality of gate lines and a second subpixel data line from the plurality of data lines, and
    wherein the pixel driving circuit of the second subpixel comprises:
        a switching transistor having a first terminal connected to the second subpixel data line; and
        a driving transistor controlling a level of a current output to an organic light emitting diode of the second subpixel according to a data voltage transferred through the switching transistor, the driving transistor having a first terminal connected to a power supply line, a second terminal connected to the OLED of the second subpixel, and a gate terminal connected to a second terminal of the switching transistor, and
    wherein a gate terminal of the switching transistor is disconnected from the second subpixel gate line such that there is a disconnection at the gate terminal of the switching transistor to form an open-circuit between the second subpixel gate line and the switching transistor of the pixel driving circuit of the second subpixel, and
    wherein the second subpixel is configured to be turned on by the pixel driving circuit of the first subpixel.

2. The organic light emitting display panel of claim 1, wherein the second subpixel is one of a blue subpixel, a red subpixel, and a green subpixel.

3. The organic light emitting display panel of claim 1, wherein the first to fourth subpixels are arranged in the order of the first subpixel, the second subpixel, the third subpixel, and the fourth subpixel; arranged in the order of the second subpixel, the first subpixel, the third subpixel, and the fourth subpixel; arranged in the order of the third subpixel, the first subpixel, the second subpixel, and the fourth subpixel; arranged in the order of the fourth subpixel, the first subpixel, the second subpixel, and the third subpixel; arranged in the order of the fourth subpixel, the second subpixel, the first subpixel, and the third subpixel; arranged in the order of the fourth subpixel, the third subpixel, the second subpixel, and the first subpixel; or arranged in the order of the fourth subpixel, the third subpixel, the first subpixel, and the second subpixel.

4. The organic light emitting display panel of claim 1, further comprising: at least one sharing pixel including the second subpixel and the first subpixel sharing an anode.

5. An organic light emitting display device comprising:
    the organic light emitting display panel of claim 1; and
    a driver driving the organic light emitting display panel.

6. The organic light emitting display panel of claim 1, wherein the pixel driving circuit of the second subpixel further comprises:
    a sensing transistor connected to a node between the driving transistor and the OLED of the second subpixel, the sensing transistor configured to turn on or turned off by a sensing pulse and configured to sense a characteristic of the driving transistor,
    wherein the sensing transistor is disconnected from a sensing line to form an open-circuit between the sensing line and the sensing transistor of the pixel driving circuit of the second subpixel.

7. The organic light emitting display panel of claim 1, wherein the disconnection at the gate terminal of the switching transistor to form the open-circuit between the second subpixel gate line and the switching transistor of the pixel driving circuit of the second subpixel is formed in response to determining that an anode of the OLED of the second subpixel is directly connected to an anode of the OLED of the first subpixel.

8. The organic light emitting display panel of claim 1, wherein the open-circuit between the second subpixel gate line and the switching transistor of the pixel driving circuit of the second subpixel is formed by cutting a connection between the second subpixel gate line and the switching transistor of the pixel driving circuit of the second subpixel.

9. The organic light emitting display panel of claim 1, wherein the driving transistor of the pixel driving circuit of the second subpixel is directly connected to the driving transistor of the pixel driving circuit of the first subpixel.

10. An organic light emitting display panel comprising:
    a plurality of gate lines, each gate line of the plurality of gate lines connected to a gate terminal of multiple switching transistors, the gate lines for supplying gate pulses to the switching transistors;
    a plurality of data lines, each data line of the plurality of data lines connected to multiple switching transistors, the data line for providing data voltages to be transferred to driving transistors through the switching transistors according to the gate pulses supplied through the plurality of gate lines; and a plurality of subpixels defined by the plurality of gate lines and the plurality of data lines, wherein:

each subpixel of the plurality of subpixels comprises an organic light emitting diode (OLED) and a pixel driving circuit driving the organic light emitting diode, a first subpixel, a second subpixel, a third subpixel, and a fourth subpixel adjacent to one another define a unit pixel, the first subpixel is a white subpixel, and the pixel driving circuit of the second subpixel is directly connected to the pixel driving circuit of the first subpixel, the second subpixel defined by a second subpixel gate line from the plurality of gate lines and a second subpixel data line from the plurality of data lines, and wherein the pixel driving circuit of the second subpixel comprises:

a switching transistor having a gate terminal connected to the second subpixel gate line; and a driving transistor controlling a level of a current output to an organic light emitting diode of the second subpixel according to a data voltage transferred through the switching transistor, the driving transistor having a first terminal connected to a power supply line, a second terminal connected to the OLED of the second subpixel, and a gate terminal connected to a second terminal of the switching transistor, and wherein the second subpixel data line is disconnected from a first terminal of the switching transistor such that there is a disconnection at the first terminal of the switching transistor to form an open-circuit between the second subpixel data line and the switching transistor of the pixel driving circuit of the second subpixel, wherein the second subpixel is configured to be turned on by the pixel driving circuit of the first subpixel.

11. The organic light emitting display panel of claim 10, wherein the second subpixel is one of a blue subpixel, a red subpixel, and a green subpixel.

12. The organic light emitting display panel of claim 10, wherein the first to fourth subpixels are arranged in the order of the first subpixel, the second subpixel, the third subpixel, and the fourth subpixel; arranged in the order of the second subpixel, the first subpixel, the third subpixel, and the fourth subpixel; arranged in the order of the third subpixel, the first subpixel, the second subpixel, and the fourth subpixel; arranged in the order of the fourth subpixel, the first subpixel, the second subpixel, and the third subpixel; arranged in the order of the fourth subpixel, the second subpixel, the first subpixel, and the third subpixel; arranged in the order of the fourth subpixel, the third subpixel, the second subpixel, and the first subpixel; or arranged in the order of the fourth subpixel, the third subpixel, the first subpixel, and the second subpixel.

13. The organic light emitting display panel of claim 10, further comprising: at least one sharing pixel including the second subpixel and the first subpixel sharing an anode.

14. An organic light emitting display device comprising: the organic light emitting display panel of claim 10; and a driver driving the organic light emitting display panel.

15. The organic light emitting display panel of claim 10, wherein the disconnection at the first terminal of the switching transistor to form the open-circuit between the second subpixel data line and the switching transistor of the pixel driving circuit of the second subpixel is formed in response to determining that an anode of the OLED of the second subpixel is directly connected to an anode of the OLED of the first subpixel.

16. The organic light emitting display panel of claim 10, wherein the open-circuit between the second subpixel data line and the switching transistor of the pixel driving circuit of the second subpixel is formed by cutting a connection between the second subpixel data line and the first terminal of the switching transistor of the pixel driving circuit of the second subpixel.

17. A method comprising:

testing an organic light emitting display panel comprising:

a plurality of gate lines, each gate line of the plurality of gate lines connected to a gate terminal of multiple switching transistors, the gate lines for supplying gate pulses to the switching transistors;

a plurality of data lines, each data line of the plurality of data lines connected to multiple switching transistors, the data line for providing data voltages to be transferred to driving transistors through the switching transistors according to the gate pulses supplied through the plurality of gate lines; and a plurality of subpixels defined by the plurality of gate lines and the plurality of data lines, wherein:

each subpixel of the plurality of subpixels comprises an organic light emitting diode (OLED) and a pixel driving circuit driving the organic light emitting diode, a first subpixel, a second subpixel, a third subpixel, and a fourth subpixel adjacent to one another define a unit pixel, and the first subpixel is a white subpixel, and wherein the pixel driving circuit of the second subpixel comprises:

a switching transistor having a gate terminal connected to a second subpixel gate line, and a first terminal connected to a second subpixel data line; and a driving transistor controlling a level of a current output to an organic light emitting diode of the second subpixel according to a data voltage transferred through the switching transistor, the driving transistor having a first terminal connected to a power supply line, a second terminal connected to the OLED of the second subpixel, and a gate terminal connected to a second terminal of the switching transistor; and responsive to determining that an anode of the OLED of the second subpixel is directly connected to an anode of the OLED of the first subpixel:

disconnecting at least one of a connection between a gate terminal of the switching transistor and the second subpixel gate line, the second subpixel data line and the first terminal of the switching transistor, and the power supply line and the first terminal of the driving transistor.

18. The method of claim 17, wherein the second subpixel is one of a blue subpixel, a red subpixel, and a green subpixel.

19. The method of claim 17, wherein the first to fourth subpixels are arranged in the order of the first subpixel, the second subpixel, the third subpixel, and the fourth subpixel;

arranged in the order of the second subpixel, the first subpixel, the third subpixel, and the fourth subpixel; arranged in the order of the third subpixel, the first subpixel, the second subpixel, and the fourth subpixel; arranged in the order of the fourth subpixel, the first subpixel, the second subpixel, and the third subpixel; arranged in the order of the fourth subpixel, the second subpixel, the first subpixel, and the third subpixel; arranged in the order of the fourth subpixel, the third subpixel, the second subpixel, and the first subpixel; or arranged in the order of the fourth subpixel, the third subpixel, the first subpixel, and the second subpixel.

20. The method of claim 17, wherein the organic light emitting display panel further comprises: at least one sharing pixel including the second subpixel and the first subpixel sharing an anode.

* * * * *